(12) United States Patent
Kim et al.

(10) Patent No.: US 8,975,660 B2
(45) Date of Patent: Mar. 10, 2015

(54) ORGANIC LIGHT EMITTING DIODE DISPLAY AND METHOD FOR MANUFACTURING THE SAME

(75) Inventors: Jin-Kwang Kim, Yongin (KR); Sang-Joon Seo, Yongin (KR); Seung-Hun Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 128 days.

(21) Appl. No.: 13/438,574

(22) Filed: Apr. 3, 2012

(65) Prior Publication Data

US 2013/0092972 A1 Apr. 18, 2013

(30) Foreign Application Priority Data

Oct. 14, 2011 (KR) .................. 10-2011-0105429

(51) Int. Cl.
*H01L 33/00* (2010.01)
*H01L 51/52* (2006.01)
*H01L 27/32* (2006.01)

(52) U.S. Cl.
CPC ......... *H01L 51/5256* (2013.01); *H01L 27/3246* (2013.01)
USPC ............................................. 257/100; 438/26

(58) Field of Classification Search
USPC ........... 257/13, 40, 66, 72, 79–103, 223, 227, 257/291, 292, 439, 443, 655, 642–643, 759, 257/E27.1, E27.125, E27.112, E29.117, 257/E29.145, E29.147, E29.151, E29.182, 257/E29.202, E29.273–E29.299, E29.314, 257/E29.32, E23.016, E51.018, E21.211, 257/E51.001–E51.052, E25.008–E25.009; 438/29, 69, 82, 486

See application file for complete search history.

(56) References Cited

U.S. PATENT DOCUMENTS

2005/0239294 A1* 10/2005 Rosenblum et al. .......... 438/778
2008/0272367 A1* 11/2008 Cok ............................... 257/40
2010/0181903 A1*  7/2010 Kim et al. ..................... 313/504

FOREIGN PATENT DOCUMENTS

KR     10-2008-0024382      3/2008
KR        10-0873704      12/2008
KR     10-2010-0097513      9/2010

* cited by examiner

*Primary Examiner* — Colleen A Matthews
*Assistant Examiner* — Junaiden Mirsalahuddin
(74) *Attorney, Agent, or Firm* — Robert E. Bushnell, Esq.

(57) ABSTRACT

An organic light emitting diode (OLED) display includes: a substrate; an organic light emitting diode formed on the substrate; a first inorganic layer formed on the substrate and covering the organic light emitting diode; an intermediate layer formed on the first inorganic layer and covering an area relatively smaller than the first inorganic layer; and a second inorganic layer formed on the first inorganic layer and the intermediate layer, and contacting the first inorganic layer at an edge thereof while covering a relatively larger area than the intermediate layer. A third inorganic layer may be formed on the second inorganic layer so as to contact the second inorganic layer at an edge thereof. At least one of the first, second and third inorganic layers is formed by an atomic layer deposition (ALD) method.

9 Claims, 5 Drawing Sheets

FIG.6

| Structure/Time | 0 h | 72 h | 168 h | 408 h | 552 h |
|---|---|---|---|---|---|
| Comparative example 1 | | | | Unable to lighting | Unable to lighting |
| Comparative example 2 | | | Unable to lighting | Unable to lighting | Unable to lighting |
| Comparative example 3 | | | | | Unable to lighting |
| Experimental example | | | | | |

ORGANIC LIGHT EMITTING DIODE DISPLAY AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 14$^{th}$ of October 2011 and there duly assigned Serial No. 10-2011-0105429.

BACKGROUND OF THE INVENTION

1. Field of the Invention

The present invention relates to an organic light emitting diode (OLED) display and a manufacturing method thereof. More particularly, the present invention relates to an OLED display using thin film encapsulation, and a manufacturing method thereof.

2. Description of the Related Art

Unlike a liquid crystal display, the OLED display has a self-emitting characteristic and does not need a separate light source such that the thickness and weight thereof are decreased. In addition, since the OLED display involves high quality characteristics such as low power consumption, high luminance, and short response time, it is spotlighted as a next generation display device for portable electronic appliances.

The OLED display includes a plurality of organic light emitting diodes, each having a hole injection electrode, an organic emission layer, and an electron injection electrode. Light is generate by energy generated when exciton generated by combining electrons and holes in an organic emission layer falls from an exited state to a ground state, and the OLED display displays the image using the same.

However, the organic emission layer sensitively reacts to the external environment such as moisture and oxygen. Thus, when the organic emission layer is exposed to moisture and oxygen, quality of the OLED display may deteriorate. Accordingly, in order to protect an organic light emitting diode and prevent permeation of moisture or oxygen into the organic emission layer, an encapsulation substrate may be attached in an air-tight manner to a display substrate where the organic light emitting diode is formed, or a thin film encapsulation may be formed on the organic light emitting diode.

In particular, the entire thickness of the OLED display can be significantly reduced by using the thin film encapsulation rather than using the encapsulation substrate. Furthermore, it is advantageous to realize a flexible display.

However, the OLED display using the thin film encapsulation can effectively prevent permeation of moisture or oxygen along a direction perpendicular to the substrate, but moisture or oxygen may be easily permeated into the substrate along an interface of the thin film encapsulation in a direction parallel to the substrate at an edge of the substrate.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide an organic light emitting diode (OLED) display that can be easily manufactured by having a relatively small structure while effectively suppressing permeation of moisture and oxygen along a side surface direction.

An OLED display according to the present invention includes: a substrate; an organic light emitting diode formed on the substrate; a first inorganic layer formed on the substrate and covering the organic light emitting diode; an intermediate layer formed on the first inorganic layer and covering an area relatively smaller than the first inorganic layer; and a second inorganic layer formed on the first inorganic layer and the intermediate layer, and contacting the first inorganic layer at an edge thereof while covering a relatively larger area than the intermediate layer.

The first inorganic layer and the second inorganic layer may be layered on the edge of the substrate.

The first inorganic layer may be formed through an atomic layer deposition (ALD) method.

The intermediate layer may include at least one of a metal oxide layer and an organic layer.

The OLED display may further include an upper layer formed on the second inorganic layer, and the upper layer may cover a relatively smaller area than the second inorganic layer.

The upper layer may cover an area that is the same as the intermediate layer.

The upper layer may include at least one of a metal oxide layer and an organic layer.

The OLED display may include a third inorganic layer formed on the second inorganic layer and the upper layer and contacting the second inorganic layer at an edge thereof while covering a relatively larger area than the upper layer.

The first inorganic layer, the second inorganic layer, and the third inorganic layer may be layered on the edge of the substrate.

At least one of the second inorganic layer and the third inorganic layer may be formed through an ALD method.

A manufacturing method of an OLED display according to another exemplary embodiment of the present invention includes: preparing a substrate; forming an organic light emitting diode on the substrate; forming a first inorganic layer covering the organic light emitting diode; forming an intermediate layer on the first inorganic layer and covering an area relatively smaller than the first inorganic layer; and forming a second inorganic layer on the first inorganic layer and the intermediate layer, and contacting the first inorganic layer at an edge thereof while covering a relatively larger area than the intermediate layer.

The first inorganic layer and the second inorganic layer may be layered on an edge of the substrate.

The first inorganic layer may be formed through an atomic layer deposition (ALD) method.

The intermediate layer may include at least one of a metal oxide layer and an organic layer.

The manufacturing method of the OLED display may further include forming an upper layer on the second inorganic layer, wherein the upper layer covers an area relatively smaller than the second inorganic layer.

The upper layer may cover an area that is the same as the intermediate layer.

The upper layer may include at least one of a metal oxide layer and an organic layer.

The manufacturing method of the OLED display may further include forming a third inorganic layer on the second inorganic layer and the upper layer, and contacting the second inorganic layer at an edge thereof while covering an area relatively larger than the upper layer.

The first inorganic layer, the second inorganic layer, and the third inorganic layer may be layered on the edge of the substrate.

At least one of the second inorganic layer and the third inorganic layer may be formed through the ALD method.

According to the exemplary embodiments of the present invention, the OLED display can have a relatively simple structure while effectively suppressing permeation of moisture and oxygen along the side surface direction.

In addition, damage to the organic light emitting diode during a process for forming the thin film encapsulation can be minimized.

Furthermore, the OLED display can be effectively and easily manufactured.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 6 is a comparison table of an experiment example and a comparative example according to the first exemplary embodiment of the present invention.

DETAILED DESCRIPTION OF THE INVENTION

Figure 1:
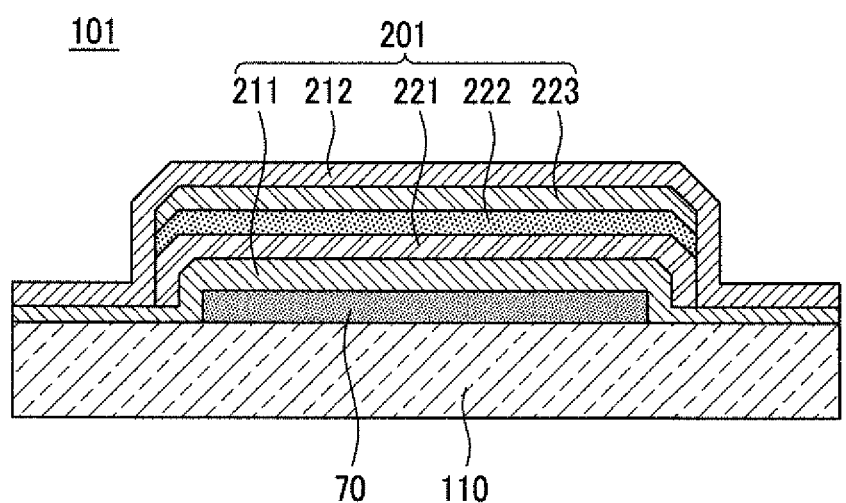
FIG. 1 is a cross-sectional view of an organic light emitting diode (OLED) display according to a first exemplary embodiment of the present invention.

The present invention will be described more fully hereinafter with reference to the accompanying drawings, in which exemplary embodiments of the invention are shown.

As those skilled in the art will realize, the described embodiments may be modified in various different ways, all without departing from the spirit or scope of the present invention.

In various exemplary embodiments, the same reference numerals are used for elements having the same configuration, and will be representatively described in a first exemplary embodiment whereas, in other exemplary embodiments, only elements different from those of the first exemplary embodiment will be described.

The drawings are schematic and not proportionally scaled down. Relative scales and ratios in the drawings are enlarged or reduced for the purpose of accuracy and convenience, and the scales are random and not limited thereto. In addition, like reference numerals designate like structures, elements, or parts throughout the specification. It will be understood that, when an element is referred to as being "on" another element, it can be directly on another element or intervening elements may be present therebetween.

Exemplary embodiments of the present invention represent ideal exemplary embodiments of the present invention in detail. As a result, modifications of diagrams are expected. Accordingly, exemplary embodiments are not limited to specific shapes of shown regions, and for example, also include modifications of the shape by manufacturing.

Hereinafter, an organic light emitting diode (OLED) display according to a first exemplary embodiment of the present invention will be described with reference to FIG. 1.

FIG. 1 is a cross-sectional view of an organic light emitting diode (OLED) display according to a first exemplary embodiment of the present invention.

As shown in FIG. 1, the OLED display 101 according to the first exemplary embodiment of the present invention includes a substrate 110, an organic light emitting diode 70, and a thin film encapsulation 201.

The substrate 110 may be made of various materials known to a person skilled in the art, and the material may include glass, quartz, ceramic, and the like. In addition, the organic light emitting diode 70 is formed on the substrate 110. The organic light emitting diode 70 emits light and the OLED display 101 displays an image.

The thin film encapsulation 201 protects the organic light emitting diode 70 by covering the same. In addition, the thin film encapsulation 201 has a multi-layered structure.

In the first exemplary embodiment of the present invention, the thin film encapsulation 201 includes a first inorganic layer 211, intermediate layers 221, 222, and 223, and a second inorganic layer 212.

The first inorganic layer 211 covers the organic light emitting diode 70. The first inorganic layer 211 is disposed most adjacent to the organic light emitting diode 70 among the layers of the thin film encapsulation 201. That is, the first inorganic layer 211 becomes the lowest layer of the thin film encapsulation 201.

The intermediate layers 221, 222, and 223 are formed on the first inorganic layer 211. The intermediate layers 221, 222, and 223 cover a relatively smaller area than the first inorganic layer 211. In further detail, the intermediate layers 221, 222, and 223 expose edges of the first inorganic layer 211.

The second inorganic layer 212 is formed on the first inorganic layer 211 and the intermediate layers 221, 222, and 223. The second inorganic layer 212 covers a relatively larger area than the intermediate layers 221, 222, and 223. In addition, the second inorganic layer 212 contacts the first inorganic layer 211 at edges thereof.

That is, the thin film encapsulation 201 has a structure in which the first inorganic layer 211 and the second inorganic layer 212 are sequentially layered on the edges of the substrate 110, and thin film encapsulation substrate 212 has a structure in which the first inorganic layer 211, the intermediate layers 221, 222, and 223, and the second inorganic layer 212 are sequentially layered on the organic light emitting diode 70.

The first inorganic layer 211 and the second inorganic layer 212 may be formed of a material including at least one of $Al_2O_3$, $TiO_2$, $ZrO$, $SiO_2$, $AlON$, $AlN$, $SiON$, $Si_3N_4$, $ZnO$, and $Ta_2O_5$.

In addition, the first inorganic layer 211 is formed through an atomic layer deposition (ALD) method. According to the ALD method, the first inorganic layer 211 may be formed by growing the above-stated inorganic materials at a temperature lower than 100° C. in order to prevent damage to the organic light emitting diode 70. The first inorganic layer 211 formed through the ALD method has high density so that permeation of moisture or oxygen can be effectively suppressed.

The intermediate layers 221, 222, and 223 are formed of multi-layers including a metal oxide layer and an organic layer. FIG. 1 illustrates that the intermediate layers 221, 222, and 223 have a triple-layered structure of a metal oxide layer, an organic layer, and a metal oxide layer, but the first exemplary embodiment of the present invention is not limited thereto. That is, the intermediate layers 221, 222, and 223 may have various complex structures known to a person skilled in the art.

Meanwhile, the organic layer 222 is formed of a polymer-based material. The polymer-based material includes an acryl-based resin, an epoxy-based resin, polyamide, and polyethylene.

In the first exemplary embodiment of the present invention, the first inorganic layer 211 is formed most adjacent to the organic light emitting diode 70. As described, the first inorganic layer 211, formed most adjacent to the organic light emitting diode 70, is formed through the above-stated ALD method, and accordingly, damage to the organic light emitting diode 70 during the process for forming the thin film encapsulation 201 can be minimized.

In addition, the first inorganic layer 211 suppresses damage to the organic light emitting diode 70 due to plasma or other impact during the process for forming the intermediate layers 221, 222, and 223.

The second inorganic layer 212 may also be formed using the ALD method, but it is not restrictive.

Furthermore, the substrate 110, the first inorganic layer 211, and the second inorganic layer 212 have relatively excellent bonding force therebetween, and thus when the first inorganic layer 211 and the second inorganic layer 212 are sequentially layered on the edge of the substrate 110, permeation of moisture or oxygen along interlayer interfaces in the side surface direction can be effectively suppressed.

In addition, the organic layer 222 of the intermediate layers 221, 222, and 223 have a relatively good planarization characteristic and can ease interlayer stress. That is, the intermediate layers 221, 222, and 223 may function to ease the interlayer stress between the first inorganic layer 211 and the second inorganic layer 212.

Furthermore, the first inorganic layer 211 and the second inorganic layer 212 may be manufactured using the same mask, and the intermediate layers 221, 222, and 223 may be manufactured using the same mask. That is, the thin film encapsulation 201 can be formed using two types of masks. Therefore, compared to the general manufacturing of a thin film encapsulation having a gradual structure, more than two masks are not required, and therefore the manufacturing process can be simplified and productivity can be improved.

With such a configuration, the OLED display 101 according to the first exemplary embodiment of the present invention can effectively suppress permeation of moisture or oxygen along the interlayer interface in the side surface direction. Furthermore, the first inorganic layer 211 in the thin film encapsulation 201 is formed most adjacent to the organic light emitting diode 70 so that damage to the organic light emitting diode 70 can be minimized.

In addition, the OLED display 101 according to the first exemplary embodiment of the present invention has a relatively simple structure, and therefore the number of masks required during the manufacturing process can be minimized.

Hereinafter, structures of the organic light emitting diode 70 and a thin film transistor for driving the organic light emitting diode 70 formed on the substrate 110 in the OLED display 101 will now be described in further detail with reference to FIG. 2.

Figure 2:
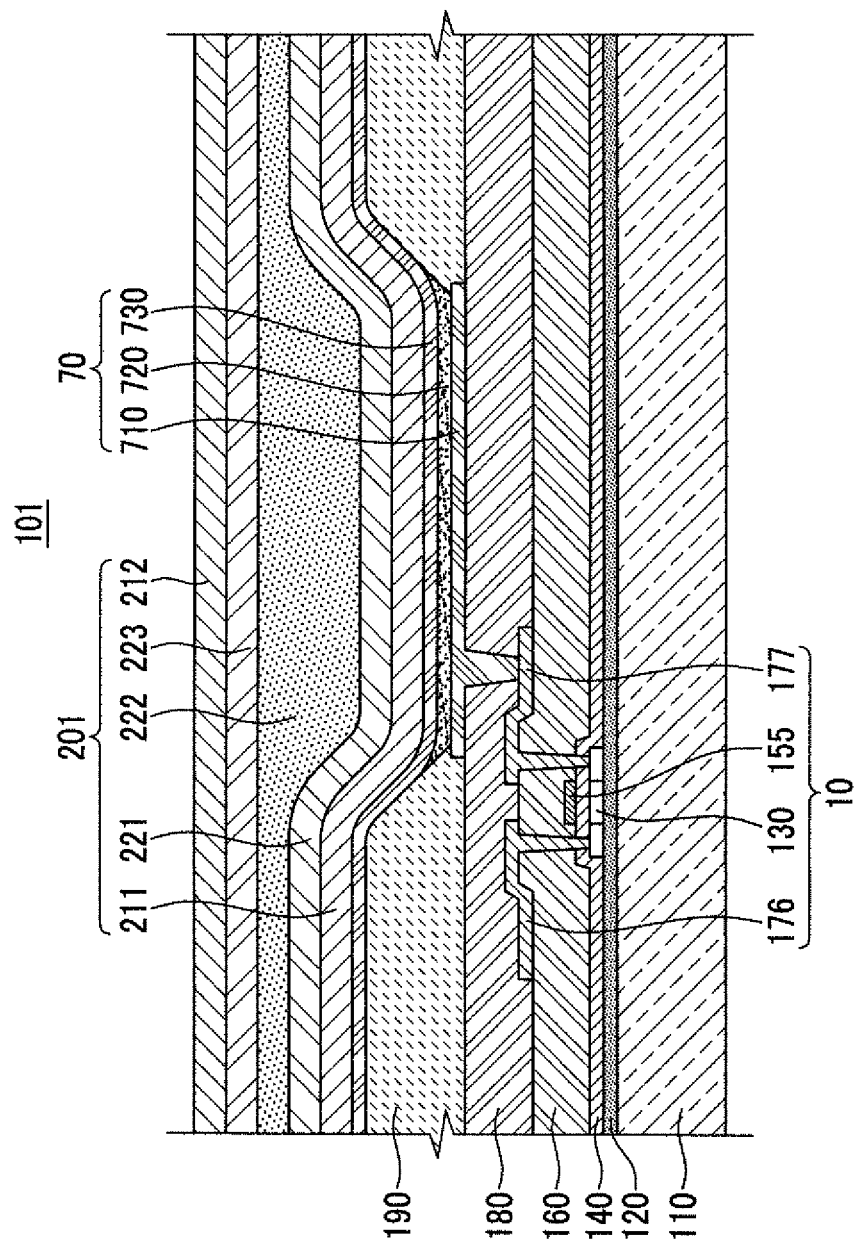
FIG. 2 is an enlarged cross-sectional view of the OLED display of FIG. 1.

FIG. 2 is an enlarged cross-sectional view of the OLED display of FIG. 1.

The thin film transistor 10 includes a semiconductor layer 130, a gate electrode 155, a source electrode 176, and a drain electrode 177.

In the first exemplary embodiment of the present invention, the semiconductor layer 130 is formed of a polysilicon layer. However, the first exemplary embodiment of the present invention is not limited thereto. Thus, the semiconductor layer 130 may be formed of an amorphous silicon layer, an oxide semiconductor, or the like.

The gate electrode 155 is disposed on one area of the semiconductor layer 130, and a gate insulation layer 140 is disposed between the gate electrode 155 and the semiconductor layer 130. The gate electrode 155 may be formed various conductive materials known to a person skilled in the art. The gate insulation layer 140 may be formed so as to include at least one of tetra ethyl ortho silicate (TEOS), silicon nitride ($SiN_x$), and silicon oxide ($SiO_2$). For example, the gate insulation layer 140 may be a double layer formed by sequentially layering a silicon nitride layer having a thickness of 40 nm and a tetra ethyl ortho silicate layer having a thickness of 80 nm. However, the gate insulation layer 140 is not limited to the above-described structure in the first exemplary embodiment of the present invention.

The source electrode 176 and the drain electrode 177 respectively contact the semiconductor layer 130. The source electrode 176 and the drain electrode 177 may be formed of various conductive materials known to a person skilled in the art. The source electrode 176 and the drain electrode 177 are separated from each other, and are insulated from the gate electrode 155. An interlayer insulation layer 160 may be disposed between the source electrode 176 and the drain electrode 177. The interlayer insulation layer 160 may be formed of various insulation materials known to a person skilled in the art.

The organic light emitting diode 70 includes a pixel electrode 710 connected to the drain electrode 177 of the thin film transistor 10, an organic emission layer 720 formed on the pixel electrode 710, and a common electrode 730 formed on the organic emission layer 720. In addition, the organic light emitting diode 70 may further include a pixel defining layer 190 having an opening partially exposing the pixel electrode 710 and defining an emission area. The organic emission layer 720 may emit light in the opening of the pixel defining layer 190.

In addition, in the first exemplary embodiment of the present invention, the structures of the thin film transistor 10 and the organic light emitting diode 70 are not limited to the structure shown in FIG. 2. The thin film transistor 10 and the organic light emitting diode 70 can have various structures that can be easily modified by a person skilled in the art.

The OLED display 101 may further include a barrier layer 120 disposed between the thin film transistor 10 and the substrate 110. In further detail, the barrier layer 120 may be disposed between the semiconductor layer 130 and the substrate 110. For example, the barrier layer 120 may have a double-layered structure comprising a single layer of silicon nitride ($SiN_x$) and a double-layer of silicon nitride ($SiN_x$) and silicon oxide ($SiO_2$). The barrier layer 120 functions to prevent permeation of unnecessary components, such as an impure element or moisture, and makes the surface flat. However, the barrier layer 120 is not a required constituent, and it may be omitted according to the type and process condition of the substrate 110.

Hereinafter, a manufacturing method of the OLED display 101 according to the first exemplary embodiment of the present invention will be described.

First, the substrate 110 formed of a material such as glass, quartz, and ceramic is prepared. In addition, the organic light emitting diode 70 is formed on the substrate 110.

Next, the first inorganic layer 211 covering the organic light emitting diode 70 is formed on the substrate 110. In this case, the edge of the first inorganic layer 211 contacts the substrate 110. In addition, the first inorganic layer 211 is formed using a material including at least one of $Al_2O_3$, $TiO_2$, ZrO, $SiO_2$, AlON, AlN, SiON, $Si_3N_4$, ZnO, and $Ta_2O_5$ through the ALD method. According to the ALD method, the first inorganic layer 211 can be formed by growing inorganic materials at a temperature lower than 100° C. to prevent damage to the organic light emitting diode 70. Furthermore, the first inorganic layer 211 formed using the ALD method has a high density so that permeation of moisture or oxygen can be effectively suppressed.

Next, the intermediate layers 221, 222, and 223 are formed on the first inorganic layer 211. In the first exemplary embodiment of the present invention, the intermediate layers 221, 222, and 223 are formed as a multiple layer including at least one of a metal oxide layer and an organic layer.

In addition, the intermediate layers 221, 222, and 223 cover a relatively smaller area than the first inorganic layer 211. That is, the intermediate layers 221, 222, and 223 expose an edge of the first inorganic layer 211. Therefore, the intermediate layers 221, 222, and 223 are formed using a mask that is different from the first inorganic layer 211.

The organic layer 222 of the intermediate layers 221, 222, and 223 may be formed using a low temperature deposition method. The low temperature deposition method may use plasma. In this case, the first inorganic layer 211 suppresses damage to the organic light emitting diode 70 during the process for forming the organic layer 222. That is, the first inorganic layer 211 can be formed without causing damage to the organic light emitting diode 70, and can suppress damage to the organic light emitting diode 70 during the post process.

Next, the second inorganic layer 212 is formed on the intermediate layers 221, 222, and 223. In this case, the second inorganic layer 212 covers a relatively larger area than the intermediate layers 221, 222, and 223. In addition, the second inorganic layer 212 contacts the first inorganic layer 211 at the edge thereof. The second inorganic layer 212 covers an area that is equivalent to the first inorganic layer 211, and in this case, the second inorganic layer 212 may be formed using the same mask used to form the first inorganic layer 211.

As described, the thin film encapsulation 201 has a structure in which the first inorganic layer 211 and the second inorganic layer 212 are layered on the edge of the substrate 110, and has a structure in which the first inorganic layer 211, the intermediate layers 221, 222, and 223, and the second inorganic layer 212 are layered on the organic light emitting diode 70.

Furthermore, since the substrate 110, the first inorganic layer 211, and the second inorganic layer 212 have a relatively strong bonding force, permeation of moisture or oxygen along an interlayer interface in the side surface direction on the edge of the substrate 110 can be effectively suppressed.

Meanwhile, the organic layer 222 of the intermediate layers 221, 222, and 223 forms a buffer between the first inorganic layer 211 and the second inorganic layer 212 so as to ease interlayer stress between the first inorganic layer 211 and the second inorganic layer 212.

With such a manufacturing method, the OLED display 101 that can effectively suppress permeation of moisture or oxygen along the interlayer interface in the side surface direction can be easily manufactured using the manufacturing method of the OLED display according to the first exemplary embodiment of the present invention.

In further detail, according to the first exemplary embodiment of the present invention, the thin film encapsulation 201 can effectively suppress the permeation of moisture or oxygen along the interlayer interface in the side surface direction while being formed using two masks.

In addition, according to the first exemplary embodiment of the present invention, the first inorganic layer 211 is first formed most adjacent to the organic light emitting diode 70, and thus damage to the organic light emitting diode 70 during the process for forming the thin film encapsulation 201 can be minimized.

Hereinafter, an OLED display according to a second exemplary embodiment of the present invention will be described with reference to FIG. 3.

Figure 3:
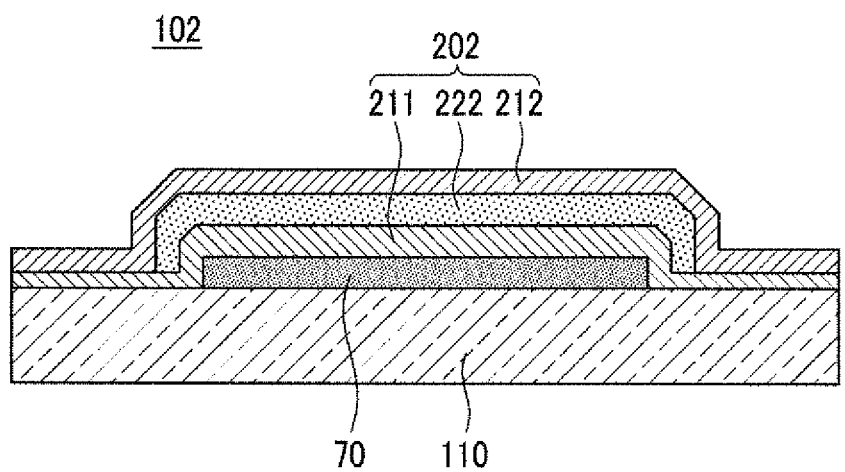
FIG. 3 is a cross-sectional view of an OLED display according to a second exemplary embodiment of the present invention.

FIG. 3 is a cross-sectional view of an OLED display according to a second exemplary embodiment of the present invention.

As shown in FIG. 3, an OLED display 102 according to the second exemplary embodiment of the present invention includes an intermediate layer 222 formed as a single layer. In this case, the intermediate layer may be an organic layer. Thus, the intermediate layer 222 is made of a polymer-based material. In this regard, the polymer-based material includes an acryl-based resin, an epoxy-based resin, polyimide, and polyethylene. In addition, the intermediate layer 222 may be formed using a low temperature deposition method.

With such a configuration, the OLED display 102 according to the second exemplary embodiment of the present invention can suppress permeation of moisture or oxygen along an interlayer interface in a side surface direction. In addition, a first inorganic layer 211 within the thin film encapsulation 202 is formed most adjacent to the organic light emitting diode 70, and thus damage to the organic light emitting diode 70 during a process for forming the thin film encapsulation 202 can be minimized.

Furthermore, the OLED display 102 according to the second exemplary embodiment of the present invention has a relatively simple structure, and therefore the number of masks required during the manufacturing process can be minimized.

The manufacturing method of the OLED display 102 according to the second exemplary embodiment of the present invention is the same as the manufacturing method of the first exemplary embodiment except that the intermediate layer 222 is formed as a single layer.

Hereinafter, an OLED display according to a third exemplary embodiment of the present invention will be described with reference to FIG. 4.

Figure 4:
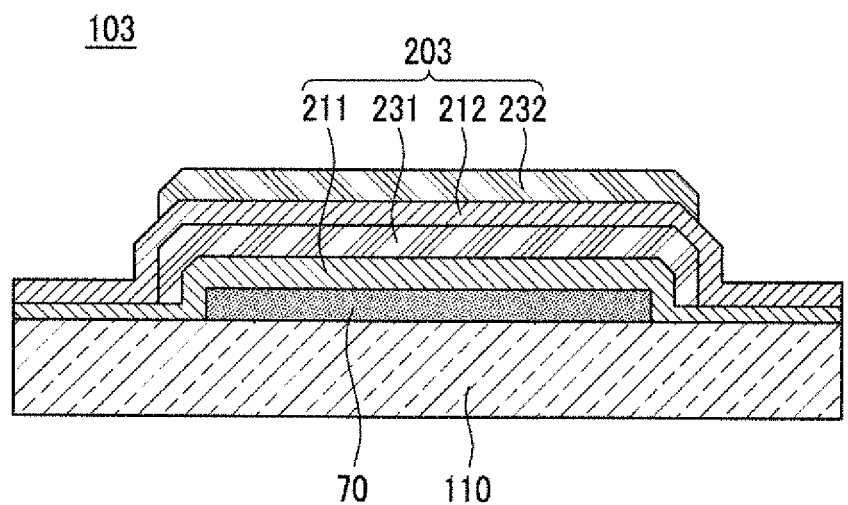
FIG. 4 is a cross-sectional view of an OLED display according to a third exemplary embodiment of the present invention.

FIG. 4 is a cross-sectional view of an OLED display according to a third exemplary embodiment of the present invention.

As shown in FIG. 4, an OLED display 103 according to the third exemplary embodiment of the present invention further includes an upper layer 232 formed on a second inorganic layer 212. The upper layer 232 covers an area relatively smaller than the second inorganic layer 212. In further detail, the upper layer 232 can cover an area that is the same as an intermediate layer 231. In this case, the upper layer 232 may be formed using the mask used to form the intermediate layer 231. In addition, like the intermediate layer 231, the upper layer 232 may include at least one of a metal oxide layer and an organic layer.

With such a configuration, the OLED display 103 according to the third exemplary embodiment of the present invention can effectively suppress permeation of moisture or oxygen along the interlayer interference in the side surface direction. In addition, a first inorganic layer 211 within the thin film encapsulation 203 is formed most adjacent to the organic light emitting diode 70, and thus damage to the organic light emitting diode 70 during a process for forming the thin film encapsulation 203 can be minimized.

The manufacturing method of the OLED display 103 according to the third exemplary embodiment of the present invention is the same as the manufacturing method of the first exemplary embodiment except that a process for forming the upper layer 232 on the second inorganic layer 212 is additionally performed.

Hereinafter, an OLED display according to a fourth exemplary embodiment of the present invention will be described with reference to FIG. 5

Figure 5:
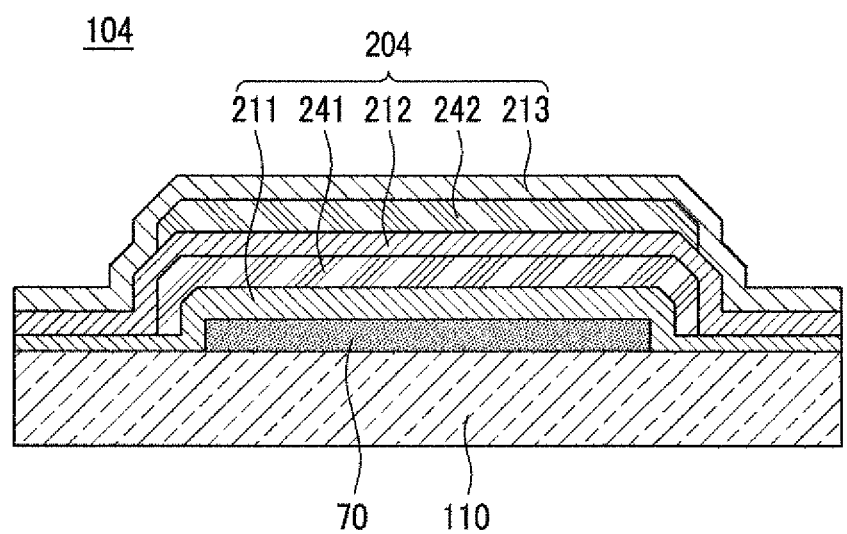
FIG. 5 is a cross-sectional view of an OLED display according to a fourth exemplary embodiment of the present invention.

FIG. 5 is a cross-sectional view of an OLED display according to a fourth exemplary embodiment of the present invention.

As shown in FIG. 5, a thin film encapsulation 204 of an OLED display 104 according to the fourth exemplary embodiment of the present invention further includes an upper layer 242 formed on a second inorganic layer 212 and a third inorganic layer 213 formed on the upper layer 242.

The upper layer 242 covers an area relatively smaller than the second inorganic layer 212. In further detail, the upper layer 242 can cover an area that is the same as an intermediate layer 241. In this case, the upper layer 242 may be formed using a mask used to form the intermediate layer 241. Furthermore, like the intermediate layer 241, the upper layer 242 may include at least one of a metal oxide layer and an organic layer.

The third inorganic layer 213 is formed so as to contact the second inorganic layer 212 at an edge thereof while covering a relatively larger area than the upper layer 242. In further detail, the third inorganic layer 213 can cover an area that is the same as the second inorganic layer 212 and, in this case, the third inorganic layer 213 may be formed using a mask used to form the first inorganic layer 211 and the second inorganic layer 212.

As described, the thin film encapsulation 204 has a structure in which the first inorganic layer 211, the second inorganic layer 212, and the third inorganic layer 213 are layered on an edge of the substrate 110, and has a structure in which the first inorganic layer 211, the intermediate layer 231, the second inorganic layer 212, the upper portion 242, and the third inorganic layer 213 are layered on an organic light emitting diode 70.

In addition, since the substrate 110, the first inorganic layer 211, the second inorganic layer 212, and the third inorganic layer 213 have a relatively strong bonding force, permeation of moisture or oxygen along an interlayer interface in the side surface direction on the edge of the substrate 110 can be effectively suppressed.

With such a manufacturing method, the OLED display 104 that can effectively suppress permeation of moisture or oxygen along the interlayer interface in the side surface direction can be easily manufactured using the manufacturing method of the OLED display according to the first exemplary embodiment of the present invention. Furthermore, the first inorganic layer 211 within the thin film encapsulation 204 is formed most adjacent to the organic light emitting diode 70, and thus damage to the organic light emitting diode 70 during the process for forming the thin film encapsulation 204 can be minimized.

The manufacturing method of the OLED display 104 according to the fourth exemplary embodiment of the present invention is the same as the manufacturing method of the first exemplary embodiment except that the upper layer 242 and the third inorganic layer 213 are formed on the second inorganic layer 212.

However, the fourth exemplary embodiment of the present invention is not limited thereto, and the thin film encapsulation 204 may include a layered inorganic layer comprising four or more layers, an intermediate layer comprising three or more layers, and an upper layer.

Hereinafter, experiment examples and different comparative examples according to the first exemplary embodiment of the present invention will be described with reference to FIG. 6.

FIG. 6 is a comparison table of an experiment example and a comparative example according to the first exemplary embodiment of the present invention.

The life-span evaluation experiments were performed with the experimental example and the comparative examples, and the experiment was performed under 50 times of acceleration life-span condition.

Comparative Example 1 includes one inorganic layer covering an organic light emitting diode, and the inorganic layer was formed using an ALD method.

Comparative Example 2 includes an organic layer covering an organic light emitting diode, and an inorganic layer formed on the organic layer and covering an area relatively larger than the area covered by the organic layer. That is, a thin film encapsulation had a gradual structure and two or more masks were used. The organic layer was formed using a low temperature deposition method and the inorganic layer was formed using the ALD method.

Comparative Example 3 includes an inorganic layer sealing an encapsulation substrate made of a known glass material and covering the encapsulation substrate. The inorganic layer was formed using the ALD method.

The Experimental Example has a structure according to the first exemplary embodiment of the present invention, and materials of inorganic and organic layers were the same as those of the comparative examples.

As shown in FIG. 6, although the ALD method was used, the Comparative Example 1 having the thin film encapsulation formed of the inorganic layer has a problem in light emission, and lighting was impossible after 408 hours. In this regard, the experiment was performed under the 50 times of acceleration life-span condition, and therefore 72 hours of the experiment is substantially estimated to 360 hours.

According to Comparative Example 2, using the thin film encapsulation formed by forming the organic layer first and then forming the inorganic layer using the ALD method, lighting was impossible after 168 hours and thus suppression of moisture permeation was weaker than that of the Comparative Example 1.

According to Comparative Example 3, the inorganic layer formed through the ALD method was added on the encapsulation substrate made of a glass material, a problem occurred in light emission after 168 hours, and lighting was impossible after 552 hours. Comparative Example 3 shows relatively strong suppression of moisture permeation compared to other comparative examples.

Meanwhile, the Experimental Example maintained light emission in good state even after 552 hours. That is, the Experimental Example has a relatively complicated structure while having a simple structure similar to Comparative Example 2, and has several times stronger permeation suppression force than that of Comparative Example 3 having the most excellent permeation suppression force among the comparative examples.

As shown in the above-described experiments, the thin film encapsulation of the OLED display according to the exemplary embodiments of the present invention can minimize damage to the organic light emitting diode during a process for forming the thin film encapsulation by forming the first inorganic layer most adjacent to the organic light emitting diode first, and can effectively suppress permeation of moisture or oxygen along an interlayer interface in the side surface direction by layering inorganic layers having relatively excellent bonding force therebetween.

Furthermore, the number of masks required during a process using the thin film encapsulation can be minimized, thereby improving productivity.

While this invention has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode (OLED) display device, comprising:
   a substrate;
   an organic light emitting diode formed on the substrate;
   a first inorganic layer formed on the substrate and covering the organic light emitting diode;
   an intermediate layer formed on the first inorganic layer and covering an area relatively smaller than the first inorganic layer; and
   a second inorganic layer formed on the first inorganic layer and the intermediate layer and contacting the first inorganic layer at an edge thereof while covering a relatively larger area than the intermediate layer;
   wherein the intermediate layer comprises at least one of an organic layer and a combination of a metal oxide layer and an organic layer.

2. The OLED display device of claim 1, the first inorganic layer and the second inorganic layer being layered on an edge of the substrate.

3. The OLED display device of claim 2, the first inorganic layer being formed by an atomic layer deposition (ALD) method.

4. The OLED display device of claim 1, further comprising an upper layer formed on the second inorganic layer, wherein the upper layer covers a relatively smaller area than the second inorganic layer.

5. The OLED display device of claim 4, wherein the upper layer covers an area that is the same as the intermediate layer.

6. The OLED display device of claim 4, wherein the upper layer comprises at least one of a metal oxide layer and an organic layer.

7. The OLED display device of claim 4, comprising a third inorganic layer formed on the second inorganic layer and the upper layer, and contacting the second inorganic layer at an edge thereof while covering a relatively larger area than the upper layer.

8. The OLED display device of claim 7, wherein the first inorganic layer, the second inorganic layer, and the third inorganic layer are layered on an edge of the substrate.

9. The OLED display device of claim 7, wherein at least one of the second inorganic layer and the third inorganic layer is formed by an ALD method.

* * * * *